(12) United States Patent
Wu et al.

(10) Patent No.: US 7,015,126 B2
(45) Date of Patent: Mar. 21, 2006

(54) METHOD OF FORMING SILICIDED GATE STRUCTURE

(75) Inventors: Chii-Ming Wu, Taipei (TW);
Cheng-Tung Lin, Jhudong (TW);
Mei-Yun Wang, Chu-Pei (TW);
Chih-Wei Chang, Hsin-Chu (TW);
Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/859,730

(22) Filed: Jun. 3, 2004

(65) Prior Publication Data

US 2005/0272235 A1    Dec. 8, 2005

(51) Int. Cl.
*H01L 21/32/05* (2006.01)
(52) U.S. Cl. .................. 438/592; 438/664; 438/682
(58) Field of Classification Search ............... 438/592, 438/655, 664, 682, 595, 649, 651; 257/384, 257/412

See application file for complete search history.

(56) References Cited

U.S. PATENT DOCUMENTS

| | | |
|---|---|---|
| 5,100,820 A | 3/1992 | Tsubone |
| 5,624,869 A | 4/1997 | Agnello et al. |
| 5,645,887 A | 7/1997 | Byun |
| 5,739,563 A | 4/1998 | Kawakubo et al. |
| 5,780,362 A * | 7/1998 | Wang et al. ........... 438/683 |
| 5,780,896 A | 7/1998 | Ono |
| 5,937,299 A | 8/1999 | Michael et al. |
| 6,008,124 A | 12/1999 | Sekiguchi et al. |
| 6,143,617 A | 11/2000 | Shue et al. |
| 6,159,781 A | 12/2000 | Pan et al. |
| 6,197,645 B1 | 3/2001 | Michael et al. |
| 6,201,303 B1 | 3/2001 | Ngo et al. |
| 6,204,133 B1 | 3/2001 | Yu et al. |
| 6,204,177 B1 | 3/2001 | Besser et al. |

(Continued)

FOREIGN PATENT DOCUMENTS

WO    PCT/JP95/00592    3/1995

OTHER PUBLICATIONS

Tavel et al., "Totally Silicided (CoSi2) Polysillicon: a novel approach to very low-resisitive gate (2 / ) without metal CMP nor etching", 2001 IEEE, pp. 37.5.1-37.5.4.

(Continued)

*Primary Examiner*—David Nelms
*Assistant Examiner*—Quoc Hoang
(74) *Attorney, Agent, or Firm*—Duane Morris LLP

(57) ABSTRACT

A method of forming a silicided gate of a field effect transistor on a substrate having active regions is provided. The method includes the following steps: (a) forming a silicide in at least a first portion of a gate; (b) after step (a), depositing a metal over the active regions and said gate; and (c) annealing to cause the metal to react to form silicide in the active regions, wherein the thickness of said gate silicide is greater than the thickness of said silicide in said active regions.

19 Claims, 6 Drawing Sheets

U.S. PATENT DOCUMENTS

| | | |
|---|---|---|
| 6,214,680 B1 | 4/2001 | Quek et al. |
| 6,225,216 B1 | 5/2001 | Ngo et al. |
| 6,228,761 B1 | 5/2001 | Ngo et al. |
| 6,232,224 B1 | 5/2001 | Inoue |
| 6,236,091 B1 | 5/2001 | Ngo et al. |
| 6,249,010 B1 | 6/2001 | Bergemont et al. |
| 6,268,257 B1 * | 7/2001 | Wieczorek et al. ......... 438/305 |
| 6,284,664 B1 | 9/2001 | Kawai |
| 6,320,213 B1 | 11/2001 | Kirlin et al. |
| 6,326,270 B1 | 12/2001 | Lee et al. |
| 6,326,290 B1 | 12/2001 | Chiu |
| 6,350,636 B1 | 2/2002 | Lee et al. |
| 6,350,688 B1 | 2/2002 | Liu et al. |
| 6,351,016 B1 | 2/2002 | Huang et al. |
| 6,362,023 B1 | 3/2002 | Bergemont |
| 6,362,086 B1 | 3/2002 | Weimer et al. |
| 6,380,014 B1 | 4/2002 | Ohta et al. |
| 6,380,578 B1 | 4/2002 | Kunikiyo |
| 6,444,578 B1 | 9/2002 | Cabral, Jr. et al. |
| 6,465,309 B1 | 10/2002 | Xiang et al. |
| 6,475,908 B1 | 11/2002 | Lin et al. |
| 6,514,859 B1 * | 2/2003 | Erhardt et al. ............... 438/664 |
| 6,524,916 B1 | 2/2003 | Scholer et al. |
| 6,562,718 B1 * | 5/2003 | Xiang et al. ................. 438/682 |
| 6,576,548 B1 | 6/2003 | Tu et al. |
| 6,602,434 B1 | 8/2003 | Hung et al. |
| 6,602,781 B1 | 8/2003 | Xiang et al. |
| 6,630,712 B1 | 10/2003 | Yu |
| 6,689,688 B1 | 2/2004 | Besser et al. |
| 6,846,734 B1 * | 1/2005 | Amos et al. ................. 438/592 |
| 2002/0019119 A1 | 2/2002 | Saigal et al. |
| 2002/0064918 A1 | 5/2002 | Lee et al. |
| 2002/0081794 A1 | 6/2002 | Ito |

OTHER PUBLICATIONS

Polishchuk et al., "Dual Work Function Metal Gate CMOS Technology Using Metal Interdiffusion", 2001 IEEE, pp. 444-446.

Lu et al., "Metal Gate Work Function Adjustment for Future CMOS Technology", 2001 Symposium on VLSI Technology digest of Technical Papers, pp. 45-46.

Yeo et al., "Effects of High-k Dielectrics on the Workfunctions of Metal and Silicon Gates", 2001 Symposium on VLSI Technology Digest of Technical Papers, pp. 49-50.

Matsuo et al., "Damascene Metal Gate MOSFETs with Co Silicided Source/Drain and High-k Gate Dielectrics," 2000 Symposium on VLSI Technology Digest of Technical Papers, pp. 70-71.

Krivokapic et al., "Nickel Silicide Metal Gate FDSOI Devices with Improved Gate Oxide Leakage", 2002 IEEE, pp. 271-273.

Lee et al., "Tunable Work Function Dual Metal Gate Technology for Bulk and Non-Bulk CMOS", 2002 IEEE, pp. 359-362.

Choi et al., "FinFET Process Refinements for Improved Mobility and Gate Work Function Engineering", 2002 IEEE, pp. 259-262.

Ranade et al., "Tunable Work Function Molybdenum Gate Technology for FDSOI-CMOS", 2002 IEEE, pp. 363-366.

* cited by examiner

METHOD OF FORMING SILICIDED GATE STRUCTURE

FIELD OF THE INVENTION

The present invention relates to semiconductor fabrication and more particularly to methods of forming field effect transistors having silicided regions.

BACKGROUND OF THE INVENTION

The principle way of reducing contact resistance between polysilicon gates and source/drain regions and interconnect lines is by forming a metal silicide atop the source/drain regions and the gate electrodes prior to application of the conductive film for formation of the various conductive interconnect lines. Presently, the most common metal silicide materials are $CoSi_2$ and $TiSi_2$, typically formed by the so called salicide (self-aligned silicide) process. In the salicide process, a thin layer of a metal, such as titanium, is blanket deposited over the semiconductor substrate, specifically over exposed source/drain and gate electrode regions. The wafer is then subjected to one or more annealing steps, for example at a temperature of 800° C. or higher for titanium. This annealing process causes the metal to selectively react with the exposed silicon of the source/drain regions and the gate electrodes, thereby forming a metal silicide (e.g., $TiSi_2$). The process is referred to as the self-aligned silicide process because the silicide layer is formed only where the metal material directly contacts the silicon source/drain regions and the polycrystalline silicon (polysilicon) gate electrode. Following the formation of the silicide layer, the unreacted metal is removed and an interconnect process is performed to provide conductive paths, such as by forming via holes through a deposited interlayer dielectric and filling the via holes with a conductive material, e.g., tungsten.

The thickness of the silicide layer is an important parameter because a thin silicide layer is more resistive than a thicker silicide layer of the same material. Therefore, a thicker silicide layer increases semiconductor speed. The formation of a thick silicide layer, however, may cause a high junction leakage current and low reliability, particularly when forming ultra-shallow junctions. The formation of a thick silicide layer consumes silicon from the underlying semiconductor substrate such that the thick silicide layer approaches and even shorts the ultra-shallow junction, thereby generating a high junction leakage current.

It is desirable to also lower the resistance of the gate electrode to increase the speed of the device. The greater the amount of silicon converted into silicide in the gate electrode, the lower the resistance will be in the gate electrode. However, formation of silicide on the gate electrode simultaneously with the source/drain regions leads to the risk of spiking in the source/drain regions if the complete silicidation of the gate electrode is attempted. This process, therefore, suffers from a very narrow processing window due to the strong likelihood that exposure of the metal and silicon to rapid thermal annealing conditions sufficient to completely silicidize a gate electrode will also cause the silicide in the source/drain region to spike and reach the bottom of the junction, undesirably causing leakage.

Various methods have been suggested for forming fully silicided gate electrodes. For example, B. Tavel et al. propose in "Totally Silicided ($CoSi_2$) Polysilicon: a novel approach to very low-resistive gate (~2 Ω/sq) without metal CMP nor etching" (IEDM 01-825) (IEEE 2001) formation of a fully silicided gate electrode by the following steps: (a) polysilicon gate electrode formation; (b) simultaneous silicidation of the source/drain and gate area, with the gate only partially silicided with a Cobalt/Titanium silicide; (c) deposition of a nitride liner; (d) deposition of a dielectric coating layer over the nitride liner; (e) chemical mechanical polishing (CMP) the dielectric and liner layers to the top surface of the gate electrode; (f) deposition of a second Cobalt/Titanium layer over the polished dielectric layer and exposed gate structure; and (g) silicidation of the remaining portion of the gate electrode.

While the method of Tavel et al. provides a fully silicided gate electrode, it is very difficult to control the gate electrode height when a CMP step is employed. For example, the polishing rate is different at the wafer center and the wafer edge. Further, the CMP process tends to result in dishing and erosion, leaving concave gate top surfaces, i.e., individual gates with non-uniform heights. Because the gate electrode height is difficult to control, i.e., each wafer may include gates having different heights and individual gates may have non-uniform heights, control of the complete silicidation of the gate electrodes is also difficult. Further, if the gate heights are too low, bridging may occur between the gates and active regions. Still further, the device speed is very difficult to control by this method.

Therefore, there remains a need for a method of increasing silicide thickness at the gate area and fully silicidizing a gate electrode, such as a method that affords greater control over the gate electrode height.

SUMMARY OF THE INVENTION

A method of forming a silicided gate of a field effect transistor on a substrate having active regions is provided. The method includes the following steps: (a) forming a silicide in at least a first portion of a gate; (b) after step (a), depositing a metal over the active regions and said gate; and (c) annealing to cause the metal to react to form silicide in the active regions, wherein the thickness of said gate silicide is greater than the thickness of said silicide in said active regions.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

The method steps described below do not form a complete process flow for manufacturing integrated circuits. The present embodiments can be practiced in conjunction with integrated circuit fabrication techniques currently used or proposed in the art or that may be developed later, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments.

Figure 1:
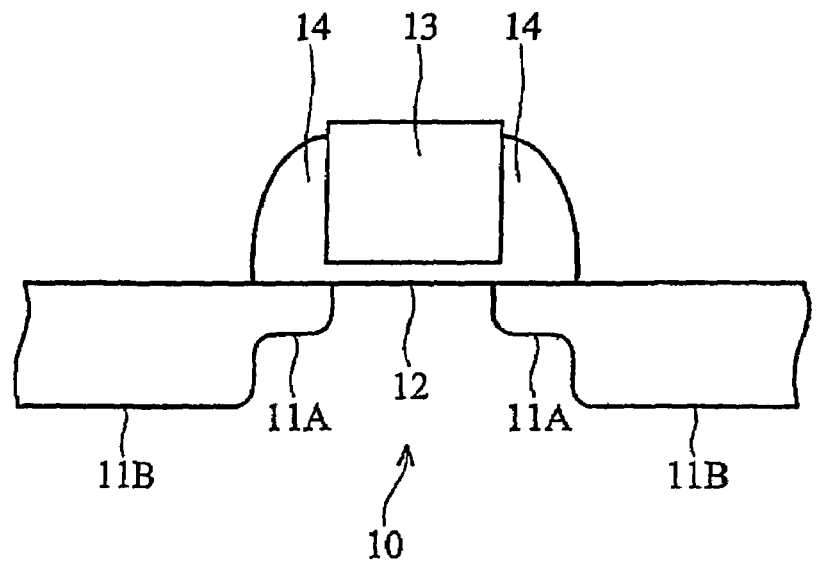
FIGS. 1–10 schematically illustrate sequential steps for forming a fully silicided gate in accordance with an embodiment of the present invention.

Sequential steps of an exemplary embodiment of the method of forming silicide regions in a semiconductor substrate are described below with respect to the schematic illustrations of FIGS. 1–10. Similar reference numerals denote similar features. Referring first to FIG. 1, a conventional transistor structure is shown comprising a substrate 10 doped with either an N-type impurity or P-type impurity, and source/drain regions 11 comprising shallow extension regions 11A and heavily doped regions 11B doped with either a P-type impurity or an N-type impurity. In an exemplary embodiment, the substrate comprises crystalline silicon, e.g., monocrystaline silicon. The substrate 10 may also be, for example, a silicon-germanium substrate, III–V compound substrate, silicon-on-insulator (SOI) substrate or other substrate. As is common, the source/drain regions 11 have a conductivity opposite to that of the substrate. The source/drain regions 11 are formed by first forming polysilicon gate electrode 13 on the substrate 10 with gate dielectric layer 12, e.g., a gate oxide such as silicon dioxide or a high-K dielectric material, therebetween. In one embodiment, the gate electrode is formed to a thickness between about 500–2000 Å. The gate electrode 13 may also comprise amorphous silicon or silicon-germanium. Using the gate electrode 13 as a mask, shallow extension regions 11A are formed. Dielectric sidewall spacers 14 are then formed on the side surfaces of the gate electrode 13. Dielectric sidewall spacers 14 may comprise any suitable dielectric material, such as silicon dioxide, silicon nitride, or a composite of silicon dioxide and silicon nitride. Ion implantation is then conducted, using the gate electrode 13 and sidewall spacers 14 as a mask to form heavily doped regions 11B. Although a conventional FET structure is shown, the method described herein is also applicable to raised source/drain, FinFET and other alternative FET designs.

Figure 2:
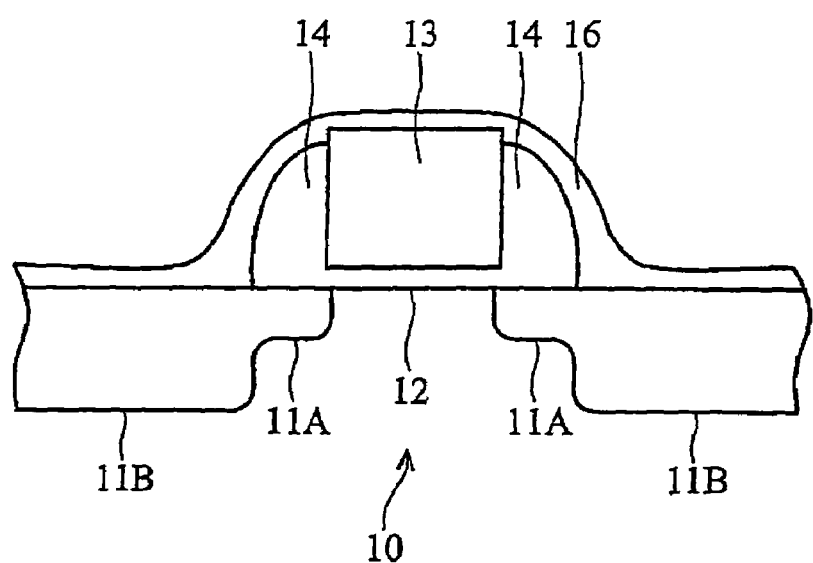

Referring to FIG. 2, a shielding layer 16, such as a layer of $SiO_2$, SiN, SiON, SiC, SiCN or some other material that will not react with the subsequently deposited metal layer, is formed over the substrate, such as by a chemical vapor deposition process or furnace process. The shielding layer 16 is conformally deposited to cover the active regions 11 and the gate electrode 13 and preferably has a thickness between about 30–1000 Å, and more preferably a thickness of about 300 Å.

Figure 3:
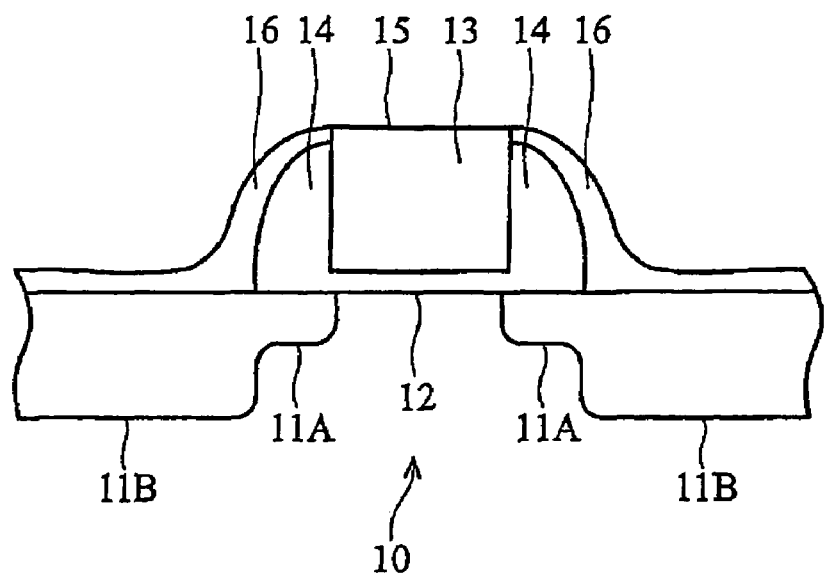

Referring to FIG. 3, a process is employed to selectively remove the shielding layer 16 over the gate electrode 13 to expose the top surface 15 of the gate electrode 13. In an exemplary embodiment, an etch process is used to remove portions of layer 16 to expose gate 13. Use of an etch process enables greater control of gate height and uniformity of gate heights across the wafer. The remaining portions of the shielding layer 16 serve to protect the source/drain regions 11 from silicidation when a subsequent metal layer is deposited over the substrate 10. In one embodiment, the mask used in forming the polysilicon gate electrode 13 is used in the lithography/etch process employed in opening the shielding layer 16, thereby ensuring good alignment with the gate electrode surface 16 in the etch process. In an exemplary process, the gate electrode 13 is exposed using a HF etch. For example, if the shielding layer 16 comprises $SiO_2$, a 1:1–1 000:1 ($HF/H_2O$ ratio) HF etchant may be used. In one embodiment, a $F^-$ dry plasma etch may be used as the etch process.

Figure 4:
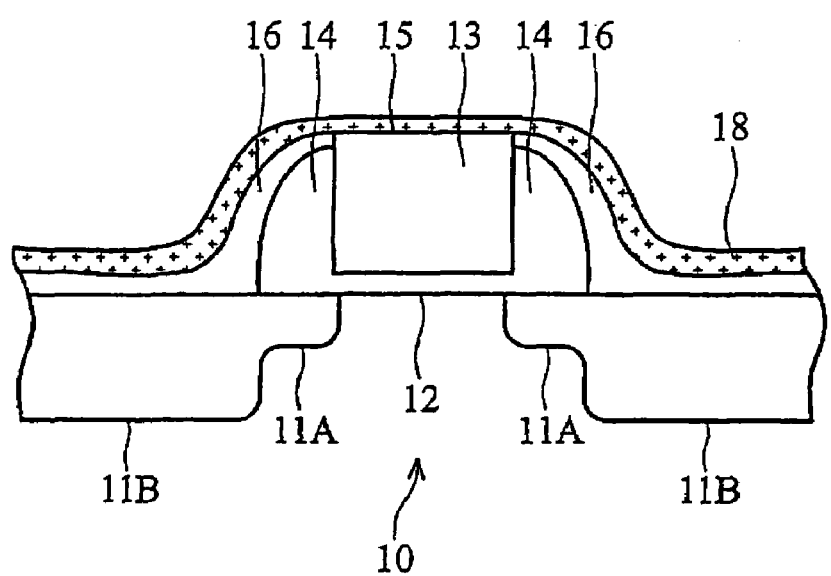

As shown in FIG. 4, metal layer 18, which may comprise a pure metal, a metal alloy or a metal with additives (e.g., C, Al, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Th, Dy, Ho, Er, Tm, Yb, Lu and mixtures thereof) that improve or change the thermal stability and/or salicide formation temperature is blanket deposited over at least the exposed portions of the upper surface 15 of the gate electrode 13. In an exemplary embodiment, layer 18 comprises cobalt/titanium (Co/Ti) (i.e., a first deposited layer of cobalt and a titanium capping layer or vice versa), cobalt/titanium nitride (Co/TiN), nickel/titanium (Ni/Ti), or nickel/titanium nitride (Ni/TiN) deposited to a thickness between about 10–2000 Å. As shown in FIG. 4, the metal layer 18 is also deposited over the remaining portions of the shielding layer 16. The metal layer 18 can be deposited in any manner, such as by chemical vapor deposition (CVD), atomic layer deposition (ALD) or by sputtering.

Figure 5:
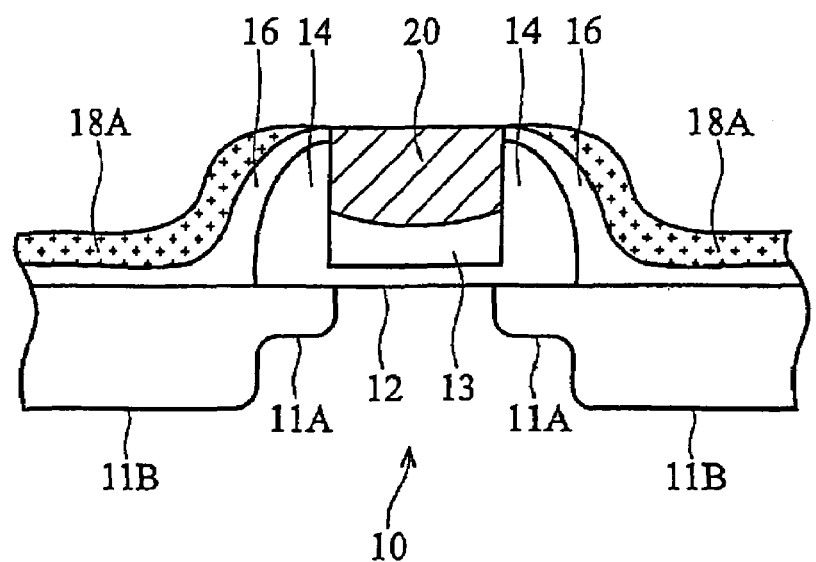
Figure 5A:
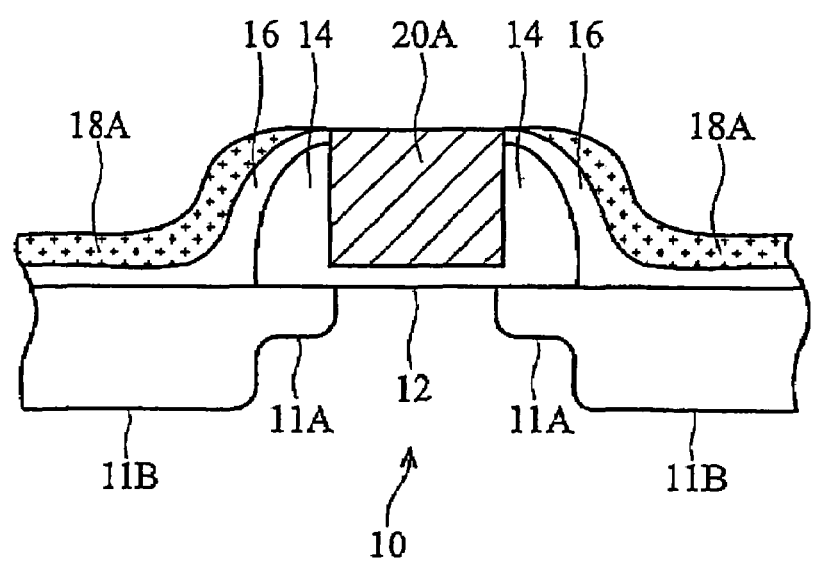

Referring to FIG. 5, an annealing step, preferably a rapid thermal annealing step, is performed. The annealing step may take place at a temperature between about 200° C. to 900° C. for about 10 to about 1000 seconds, depending upon the metal that is employed and the desired depth of the silicide layer 20. Upon annealing, a metal silicide layer 20, e.g., cobalt silicide, nickel silicide, etc. is formed in at least a portion of the gate electrode 13, leaving a remaining portion unsilicided, or optionally, fully siliciding gate electrode 13 (as shown in, for example, gate 20A of FIG. 5A). For some silicides, e.g., CoSi2, TiSi, etc., a two-step rapid thermal anneal process is utilized to form metal silicide layer 20.

Figure 6:
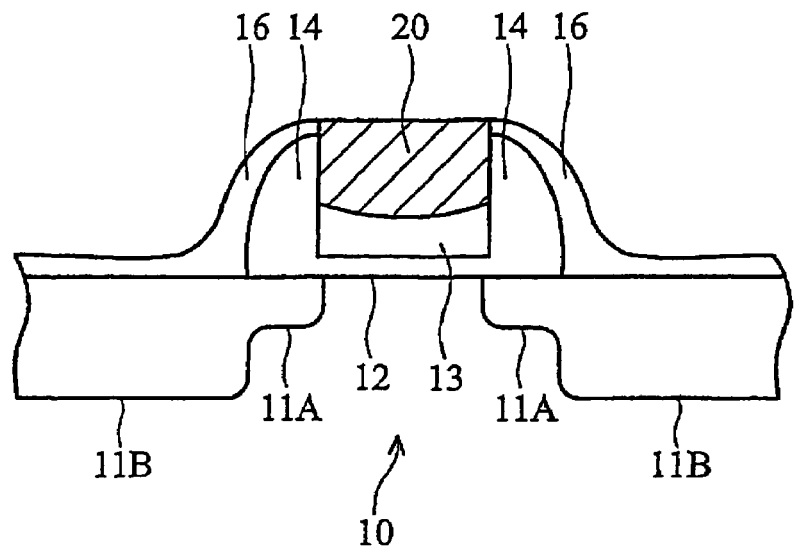

Referring to FIG. 6, any unreacted metal 18A (FIG. 5) is removed from the substrate 10, leaving remaining portions of shielding layer 16. The unreacted metal layer 18A may be removed by a wet chemical etch, for example, or other process. In an exemplary embodiment, the unreacted metal is removed using an $HNO_3$, HCl, $NH_4OH$, $H_2SO_4$ or other acid etchant, such as a mix of acids. In one embodiment, the etching is performed between about room temperature and 150° C. for between about 2–60 minutes.

Figure 7:
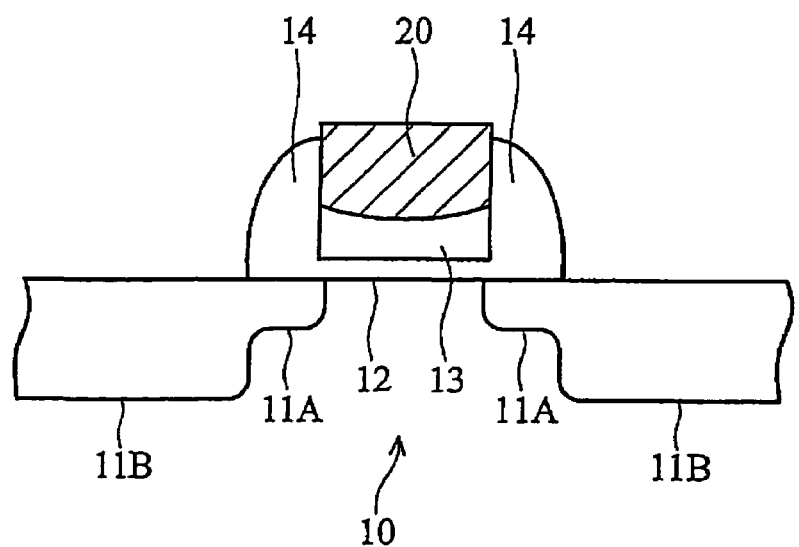

Referring now to FIG. 7, the remaining portions of the shielding layer 16 disposed over the spacers 14 and active regions 11 are removed to expose the active regions, i.e., source/drain regions 11, for silicidation. In an exemplary embodiment, the remaining portions of the shielding layer 16 are removed using a HF etch.

Figure 8:
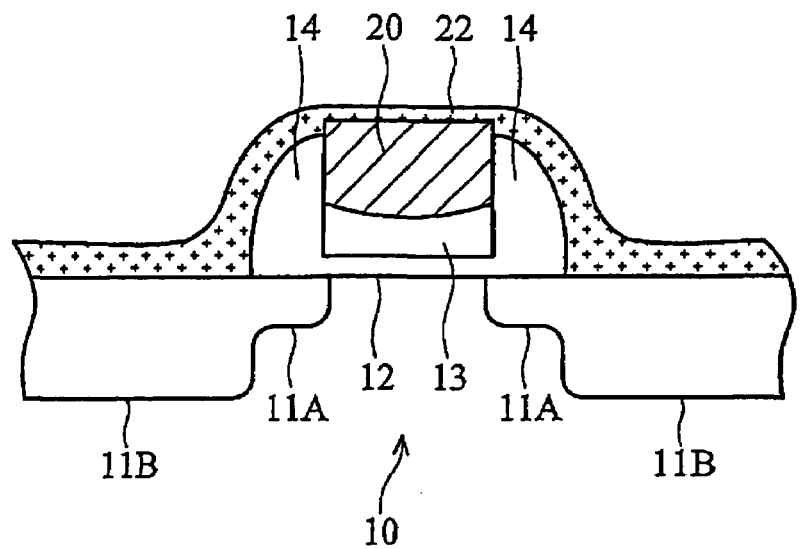

Referring to FIG. 8, a second layer of metal 22, preferably, but not necessarily, the same metal deposited to form layer 18, is deposited over the substrate 10 to cover the top surface of the silicide layer 20 of the gate electrode and the source/drain regions 11. As noted above, exemplary metal layers may comprise cobalt/titanium (Co/Ti), cobalt/titanium nitride (Co/TiN), nickel/titanium (Ni/Ti), or nickel/titanium nitride (Ni/TiN). The metal layer 22 is deposited to a thickness sufficient to produce silicide layers having a desired thicknesses in the source/drain regions 11 and, optionally, to complete or partially complete the silicidation of the remaining unsilicided portions of the gate electrode 13. In one embodiment, the silicide formed in the gate electrode 13 is thicker than the silicide that is formed in the active regions. In a further embodiment, the gate electrode is fully silicidize. By "fully silicidize" or "fully silicided" it is meant that the gate electrode is substantially silicided, meaning, in one embodiment, silicide forms in at least 90–100 percent of the gate height, and more preferably at least 95–100 percent of the height of the gate.

Figure 9:
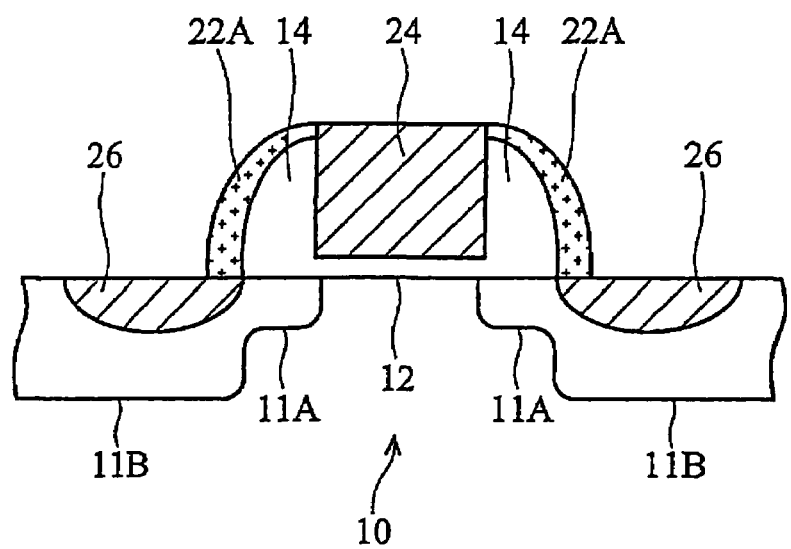
Figure 9A:
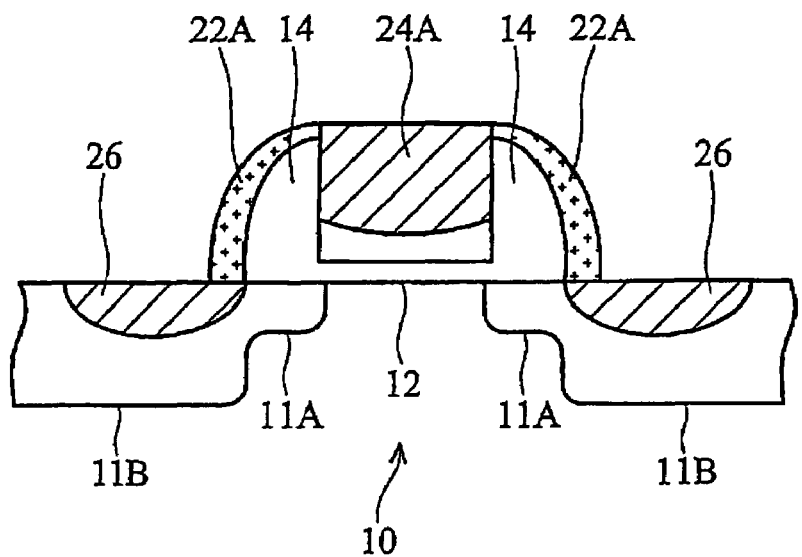

Referring to FIGS. 9 and 9A, a rapid thermal anneal process is again applied to the substrate causing the metal 22 to react with source/drain regions 11. Silicide regions 26 are formed to a desired depth in active regions 11. In one embodiment, the processing time and temperature of the second anneal is limited to prevent (in whole or in part) additional diffusion of metal atoms into the gate electrode 13, leaving a partially silicided gate as shown in FIG. 9A, but with the gate silicide 24A that is thicker than the silicide 26 in the active regions. In essence, the silicide 20 formed from the first metal deposition and annealing serves as a barrier to further diffusion. In this embodiment, gate 13 is fully silicided by the first anneal (if a fully silicided gate is required) or initially, partially silicided to a thickness greater than the eventual thickness of silicides 26 in the active regions. In the embodiment shown in FIG. 9, metal layer 20 is processed for sufficient time and at a sufficient temperature to promote further metal diffusion into the gate to promote additional silicidation or, in one embodiment, full silicidation.

By controlling and limiting the thickness of the silicide in the active regions, junction shorts are prevented. By thickening the gate silicide, device speed is improved. Fully silicided gates allow for control of the work function of the device.

Although cobalt/titanium (Co/Ti), cobalt/titanium nitride (Co/TiN), nickel/titanium (Ni/Ti), and nickel/titanium nitride (Ni/TiN) have been described as a preferred metals for the embodiments described herein, other metals or alloys that form silicides and are predominant diffusion species may be used, such as Nickel (Ni), Palladium (Pd), Chromium (Cr), Cobalt (Co), Titanium (Ti), Tungsten (W), Molybdenum (Mo), etc. Annealing process parameters and metal thickness may change dependent on the metal selected for layer 22. Assuming the example above where layer 22 is deposited to a thickness of about 20–150 Å and assuming layer 22 comprises nickel, the substrate is annealed at a temperature between about 200–700° C. for a time of about 10–500 seconds, thereby forming silicide regions 26 to a depth of about 40–300 Å, in some embodiments, completing silicidation of the gate.

Figure 10:
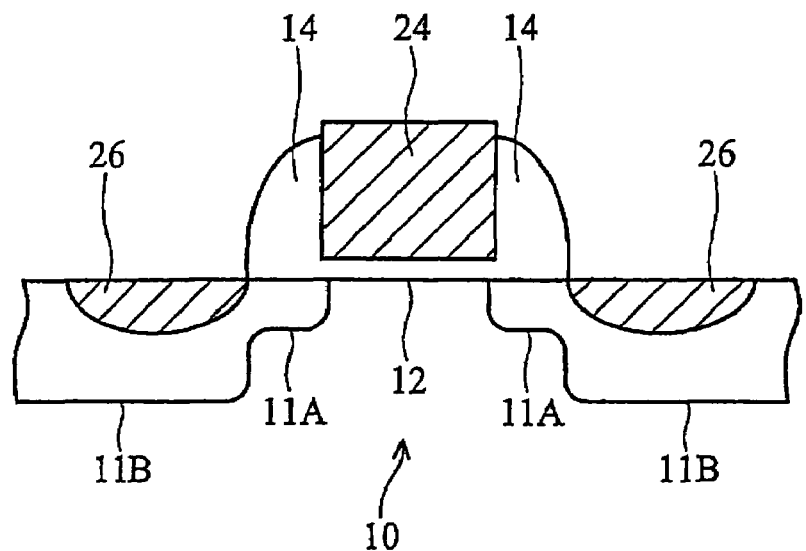

Referring to FIG. 10, the unreacted portions of metal layer 22A (FIG. 9) are removed, thereby providing a silicidized gate electrode 24 and silicided source/drain regions 26 where the gate electrode silicidation is thicker than the silicidation of the active regions, thereby increasing device speed without shorting ultra-shallow junctions. A wet chemical etch that is highly selective to the unreacted metal layer 22 relative to the silicide may be employed to remove the unreacted metal 22A. In an exemplary embodiment, the unreacted metal 22A is removed using an $HNO_3$, HCl, $NH_4OH$, $H_2SO_4$ or other acid etchant.

The manufacturing process described herein is adaptable to manufacturing any of the various types of semiconductor devices, particularly advanced deep-submicron CMOS devices, such as 0.1 micron devices with ultra-shallow junctions, e.g., above 500 Å to about 2000 Å, while significantly improving the reliability of ultra-shallow junctions. Parasitic, sheet and contact resistance between the active regions and the gate electrode and interconnects is achieved without increasing junction leakage current. Further, because no polishing or etch back process need be employed to expose the surface of the gate electrode for silicidation, the height of the gate electrode is more easily controlled, thereby facilitating greater control of the silicidation process itself in forming fully silicided gate electrode 24 and silicided active regions 26.

The method described herein also provides for excellent control of the gate electrode height during the silicidation process. The process has an improved process window for exposing the top surface of the gate electrode in a two-step silicidation formation process, thereby facilitating improved control of the silicidation process, which provides improved silicided gates, and consequent benefits thereof, such as lower gate electrode resistance, improved device speed, prevention or reduction of boron migration into the gate electrode and reduction or elimination of the depletion effect, without high junction leakage current or spiking.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a silicided gate of a field effect transistor on a substrate having active regions, comprising the steps of:
   (a) forming a shielding layer over said substrate, including over said active regions, said shielding layer having an opening therein to expose a surface of said gate electrode;
   (b) fully siliciding said gate electrode, wherein said shielding layer prevents formation of said silicide in said active regions during step (b);
   (c) after step (b), depositing a metal over the active regions and said gate electrode; and
   (d) annealing to cause the metal to react to form silicide in the active regions, wherein the thickness of said gate silicide is greater than the thickness of said silicide in said active regions.

2. The method of claim 1, wherein said shielding layer is conformally formed over said substrate, including over said gate, said method further comprising the step of etching said opening in said shielding layer to expose said surface of said gate.

3. The method of claim 1, wherein said shielding layer has a thickness between about 30–1000 Å.

4. The method of claim 3, wherein said shielding layer comprises SiO2, SiN, SiC, SiCN or SiON.

5. The method of claim 1, wherein step (b) comprises:
   conformally depositing a layer of metal over said substrate, including over said shielding layer and said exposed surface of said gate electrode; and
   annealing to form said silicide in said gate electrode, wherein the shielding layer prevents said metal deposited over said shielding layer from reacting with the active regions during said annealing step.

6. The method of claim 5, wherein said metal layer deposited over said shielding layer is selected from the group consisting of Co/Ti, Co/TiN, Ni/Ti and Ni/TiN.

7. The method of claim 1, wherein said shielding layer is conformally formed over said substrate, including over said gate, said method further comprising the step of forming said opening in said shielding layer to expose said surface of said gate.

8. The method of claim 1, further comprising, after step (b) and before step (c) removing said shielding layer from over said active regions.

9. The method of claim 1, wherein the metal layer deposited in step (c) is selected from the group consisting of Co/Ti, Co/TiN, Ni/Ti and Ni/TiN.

10. The method of claim 1, wherein the height of the gate is between about 500–2000 Å.

11. The method of claim 1, wherein the silicide formed in the gate and active regions comprises Co, Ni or Ti.

12. The method of claim 1, wherein said gate silicide comprises a first metal silicide formed from a first metal and said silicide in said active regions comprises a second metal silicide formed from a second metal different from said first metal.

13. A method of forming a silicided gate of a field effect transistor on a substrate having active regions, comprising the steps of:
- conformally depositing a shielding layer over the active regions and gate, wherein said gate comprises silicon, said gate having sidewall spacers formed adjacent thereto, said shielding layer being formed over said sidewall spacers;
- etching an opening in said shielding layer to expose a top surface of said gate;
- depositing a first metal layer over said substrate, including on said exposed surface of said gate;
- annealing to cause said first metal to react with said gate, wherein said gate is fully silicided, wherein said shielding layer prevents formation of said silicide in said active regions during said annealing step;
- removing unreacted portions of said first metal layer;
- removing remaining portions of said shielding layer;
- depositing a second metal over said substrate, including over said active regions and said gate; and
- annealing to cause said second metal to react with said active regions to form silicide therein, wherein the thickness of said gate silicide is greater than the thickness of said silicide in said active regions.

14. The method of claim 13, wherein said shielding layer has a thickness between about 30–1000 Å.

15. The method of claim 14, wherein said shielding layer comprises SiO2, SiN, SiC, SiCN or SiON.

16. The method of claim 13, wherein said first and second metals are selected from the group consisting of Co/Ti, Co/TiN, Ni/Ti and Ni/TiN.

17. The method of claim 13, wherein the height of the gate is between about 500–2000 Å.

18. The method of claim 13, wherein the silicide formed in the gate and active regions comprises Co, Ni or Ti.

19. The method of claim 13, wherein said gate silicide comprises a first metal silicide formed from a first metal and said silicide in said active regions comprises a second metal suicide formed from a second metal different from said first metal.

* * * * *

UNITED STATES PATENT AND TRADEMARK OFFICE
CERTIFICATE OF CORRECTION

PATENT NO. : 7,015,126 B2
APPLICATION NO. : 10/859730
DATED : March 21, 2006
INVENTOR(S) : Chii-Ming Wu et al.

It is certified that error appears in the above-identified patent and that said Letters Patent is hereby corrected as shown below:

Column 3, line 63, delete "1:1-1 000:1" and insert therefor --1:1-1000:1--; and

Column 8, line 21, delete "suicide" and insert therefor --silicide--.

Signed and Sealed this

Ninth Day of January, 2007

JON W. DUDAS
*Director of the United States Patent and Trademark Office*